United States Patent
Kanda et al.

(10) Patent No.: US 7,684,258 B2
(45) Date of Patent: Mar. 23, 2010

(54) SEMICONDUCTOR MEMORY AND CONTROLLER WITH TIME-SHARED MODE FOR ROW ADDRESS, COLUMN ADDRESS AND DATA MASK SIGNALS INPUTTED VIA ADDRESS TERMINALS

(75) Inventors: Tatsuya Kanda, Kawasaki (JP); Kotoku Sato, Kawasaki (JP)

(73) Assignee: Fujitsu Microelectronics Limited, Tokyo (JP)

( * ) Notice: Subject to any disclaimer, the term of this patent is extended or adjusted under 35 U.S.C. 154(b) by 338 days.

(21) Appl. No.: 11/705,405

(22) Filed: Feb. 13, 2007

(65) Prior Publication Data

US 2008/0025127 A1    Jan. 31, 2008

(30) Foreign Application Priority Data

Jul. 12, 2006   (JP) .............................. 2006-191685

(51) Int. Cl.
*G11C 7/10* (2006.01)

(52) U.S. Cl. ............... 365/189.03; 365/120; 365/230.01

(58) Field of Classification Search ............. 365/120 X, 365/189.011, 189.03 O, 230.01 X, 230.003, 365/230.08, 230.09, 233.1, 189.03, 230.01

See application file for complete search history.

(56) References Cited

U.S. PATENT DOCUMENTS

| | | | |
|---|---|---|---|
| 5,497,353 A * | 3/1996 | Sato et al. ............... | 365/230.05 |
| 6,088,760 A * | 7/2000 | Walker et al. ............... | 711/104 |
| 6,205,046 B1 * | 3/2001 | Maesako ..................... | 365/120 |
| 6,535,965 B1 | 3/2003 | Ikeda et al. | |
| 7,145,816 B2 * | 12/2006 | Abedifard ................... | 365/200 |
| 2005/0105380 A1 | 5/2005 | Takahashi et al. | |
| 2005/0265086 A1 | 12/2005 | Takano et al. | |
| 2006/0034136 A1 | 2/2006 | Abedifard | |

FOREIGN PATENT DOCUMENTS

| | | |
|---|---|---|
| EP | 61050281 A | 3/1986 |
| EP | 02177190 A | 7/1990 |
| JP | 2000-132964 A | 5/2000 |
| JP | 2005-182530 A | 7/2005 |
| KR | 2001-0037711 | 5/2001 |
| KR | 2004-0019005 | 3/2004 |

\* cited by examiner

*Primary Examiner*—Van Thu Nguyen
(74) *Attorney, Agent, or Firm*—Arent Fox LLP

(57) ABSTRACT

To perform mask control of data signals without increasing the number of external terminals even when the number of bits in a data mask signal is large, an address input circuit sequentially receives a first address signal, a second address signal, and a first data mask signal supplied to an address terminal in synchronization with transition edges of a clock signal. Namely, the first data mask signal is supplied to the address terminal at a different timing from timing at which the first and second address signals are received. The first address signal, second address signal, and first data mask signal are output, for example, from a controller accessing a semiconductor memory. A data input/output circuit inputs/outputs data via a data terminal and masks at least either of write data to memory cells and read data from the memory cells in accordance with logic of the first data mask signal.

17 Claims, 14 Drawing Sheets

Fig. 6

|  | BLK0 | BLK1 | BLK2 | BLK3 | BLK4 | ..... | BLK30 | BLK31 |
|---|---|---|---|---|---|---|---|---|
| RAD8 | 0 | 1 | 0 | 1 | 0 | ----- | 0 | 1 |
| RAD9 | 0 | 0 | 1 | 1 | 0 | ----- | 1 | 1 |
| RAD10 | 0 | 0 | 0 | 0 | 1 | ----- | 1 | 1 |
| RAD11 | 0 | 0 | 0 | 0 | 0 | ----- | 1 | 1 |
| RAD12 | 0 | 0 | 0 | 0 | 0 | ----- | 1 | 1 |

ARY: 256 WL (RAD0–7), 256 BL,/BL×64 DQ (CAD0–7), with blocks BLK0–BLK31 and RBLK.

SEMICONDUCTOR MEMORY AND CONTROLLER WITH TIME-SHARED MODE FOR ROW ADDRESS, COLUMN ADDRESS AND DATA MASK SIGNALS INPUTTED VIA ADDRESS TERMINALS

CROSS REFERENCE TO RELATED APPLICATION

This application is based upon and claims the benefit of priority from Japanese Patent Application No. 2006-191685, filed on Jul. 12, 2006, the entire contents of which are incorporated herein by reference.

BACKGROUND OF THE INVENTION

1. Field of the Invention

The present invention relates to a semiconductor memory and a controller for accessing the semiconductor memory.

2. Description of the Related Art

With progress of semiconductor manufacturing technology, the number of elements that can be mounted in a controller of an ASIC (Application Specific IC) or the like is increasing year by year. In response to the rising number of elements, it becomes possible to mount various functional blocks chip, which have conventionally been configured by separate chips, on a single ASIC. As ASICs have more advanced features, the number of external terminals tends to increase. Also, in order to increase a data transfer rate, the number of data terminals tends to increase. Since the size of a pad, which is an external terminal, is determined based on packaging technology, even when the size of elements decreases with progress of semiconductor manufacturing technology, the size of the pad cannot be decreased in the same ratio as that of the size of elements. Also, an electrostatic protection circuit for protecting elements from static electricity and a buffer circuit for inputting/outputting signals from/to outside are generally required for each external terminal. The size of elements in these circuits is larger than that of transistors formed in functional blocks inside a chip. Thus, when the number of external terminals increases, chip size of LSI tends to become larger and chip cost tends to become higher.

On the other hand, to reduce the number of external terminals of a controller, reduction in the number of external terminals also in a semiconductor memory connected to the controller is also demanded. For example, for a DRAM receiving a row address signal and a column address signal in a time-sharing mode, a technology in which a mask signal is received together with a column address signal has been proposed to reduce data mask terminals for masking write data (for example, Japanese Unexamined Patent Application Publication No. 2005-182530). Also, a technology in which a data mask signal is received using an unused column address terminal has been proposed to reduce data mask terminals (for example, Japanese Unexamined Patent Application Publication No. 2000-132964).

Data is generally masked in units of byte. As described above, the number of data terminals tends to increase. In response to the rising number of data terminals, the number of bits of a data mask signal must also be increased. In the conventional technology described above, a data mask signal is supplied using unused bits of a column address signal. Generally, unused bits are about two bits. In that case, only two-byte data can be masked. No technology has been proposed that can mask data without increasing the number of external terminals when the number of bytes of data increases and the number of bits of a data mask signal increases.

SUMMARY OF THE INVENTION

An object of the present invention is to perform mask control of data without increasing the number of external terminals even when the number of bits of a data mask signal is large.

In the present invention, an address input circuit sequentially receives a first address signal, a second address signal, and a first data mask signal supplied to an address terminal in synchronization with transition edges of a clock signal. That is, the first data mask signal is supplied to the address terminal at a different timing from that at which the first address signal or second address signal is received. The first address signal, second address signal, and first data mask signal are output, for example, from a controller accessing semiconductor memory. A data input/output circuit inputs/outputs data via data terminals. The data input/output circuit masks at least either of write data to memory cells and read data from memory cells in accordance with logic of the first data mask signal. This makes it possible to perform mask control of data without increasing the number of external terminals even when the number of bits in the first data mask signal is large.

BRIEF DESCRIPTION OF THE DRAWINGS

The nature, principle, and utility of the invention will become more apparent from the following detailed description when read in conjunction with the accompanying drawings in which like parts are designated by identical reference numbers, in which:

FIG. 6 is a block diagram showing details of a memory cell array shown in FIG. 5;

DESCRIPTION OF THE PREFERRED EMBODIMENTS

Embodiments of the present invention will be described below with reference to drawings. A signal line shown as a thick line in a diagram consists of a plurality of lines. Also, a part of blocks to which thick lines are connected consist of a plurality of circuits. The same symbol as a signal name is used for a signal line through which the signal is transmitted. A signal beginning with "/" denotes negative logic. A double circle in a diagram denotes an external terminal.

Figure 1:
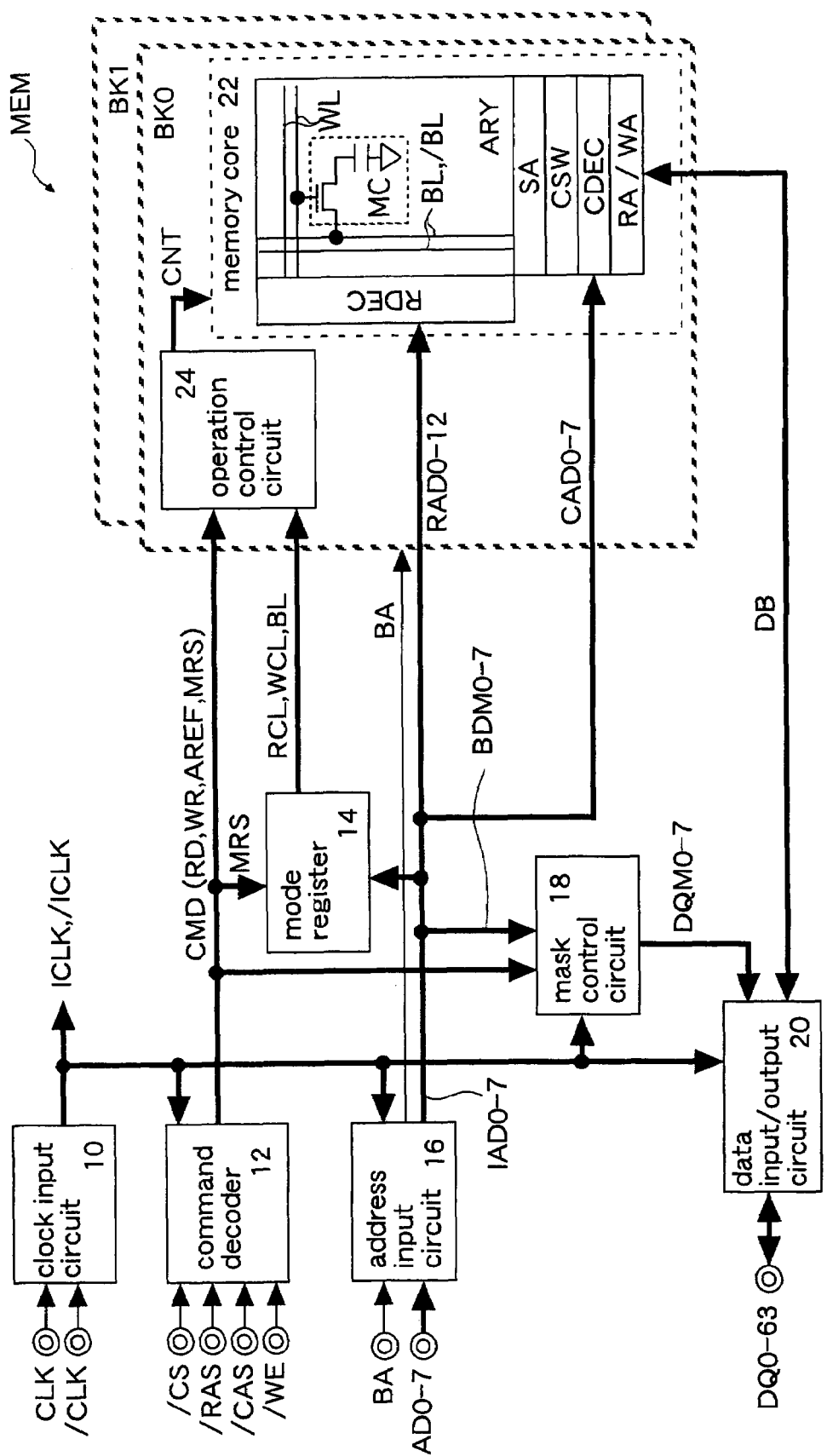
FIG. 1 is a block diagram showing a first embodiment of the present invention.

FIG. 1 shows the first embodiment of the present invention. A semiconductor memory MEM is, for example, a clock synchronous type FCRAM (Fast Cycle RAM) operating in synchronization with an external clock CLK. The FCRAM is a pseudo SRAM having memory cells of DRAM and an interface of SDRAM. The memory MEM includes a clock input circuit 10, a command decoder 12, a mode register 14, an address input circuit 16, a mask control circuit 18, a data input/output circuit 20, and banks BK0 and BK1. Each of the banks BK0 and BK1 has a memory core 22 and an operation control circuit 24, and operates independently of each other.

The clock input circuit 10 receives complementary clock signals CLK and /CLK via clock terminals and supplies the received clocks CLK and /CLK to each circuit block as its internal clocks ICLK and /ICLK. Incidentally, a clock enable signal CKE may be supplied to the clock input circuit 10 to stop generation of the internal clocks ICLK and /ICLK while the clock enable signal CKE is at a low logical level.

The command decoder 12 receives a chip select signal /CS, a row address strobe signal /RAS, a column address strobe signal /CAS, and a write enable signal /WE in synchronization with rising edges of the clock signal CLK. The command decoder 12 outputs a command recognized in accordance with a logical level of received signals, for example, as an access command CMD for performing an access operation of the banks BK0-1. In the following description, a chip select signal /CS may be abbreviated as a /CS signal, a write enable signal /WE as a /WE signal and so on. The access command CMD includes a read command RD, a write command WR, an auto refresh command AREF, and a mode register set command MRS.

The mode register 14 is set in accordance with an address signal AD0-7 (RAD0-12 described later) supplied in synchronization with the mode register set command MRS. A read latency RCL, a write latency WCL, a burst length BL and the like are set to the mode register 14. The read latency RCL denotes the number of clock cycles between acceptance of the read command RD and output of read data. The write latency WCL denotes the number of clock cycles between acceptance of the write command WR and reception of write data. The burst length BL denotes the number of times of data DQ input or output by the read command or write command.

The address input circuit 16 receives a bank address signal BA supplied to a bank address terminal in synchronization with rising edges of the clock signal CLK and outputs the received bank address signal BA to the banks BK0-1. Also, the address input circuit 16 sequentially receives the address signal AD0-7 supplied to the address terminal in synchronization with rising edges or falling edges of the clock signal CLK and outputs the received signal as an internal address signal IAD0-7. The internal address signal IAD0-7 is, as described later, one of a row address signal RAD0-12 (first address signal), a column address signal CAD0-7 (second address signal), and a data mask signal BDM0-7 (first data mask signal).

The memory MEM in the present embodiment is an address multiplex type semiconductor memory that sequentially receives the row address signal RAD0-12 and column address signal CAD0-7 via common address terminals AD0-7. In a conventional SDRAM, an address signal AD is received in synchronization with only rising edges of the clock signal CLK. In contrast, in the memory MEM according to the present invention, the address signal AD is received in synchronization with both rising and falling edges of the clock signal CLK. Thus, if the row address signal RAD0-12 is divided into two portions and received, for example, a frequency of supplying the address signal AD can be made the same as before. Also, the data mask signal BDM0-7 can further be received while the same frequency of supplying the column address signal CAD0-7 is maintained. The numbers of bits of the address signals RAD and CAD are not limited to those in this example.

The number of bits of the address terminals AD0-7 is set by adjusting to that of the column address signal CAD0-7. The number of bits of the row address signal RAD0-12 is larger than that of the column address signal CAD0-7. Thus, the row address signal RAD is supplied to the memory MEM at two different times. The maximum number of bits of the data mask signal BDM, on the other hand, can be extended to the number of bits of the column address signal CAD. Thus, the number of bits of the data mask signal BDM0-7 can be considerably increased compared with that of conventional SDRAM The mask control circuit 18 receives the data mask signal BDM0-7 in synchronization with falling edges of the clock signal CLK that received the write command WR or read command RD and outputs the received signal to the data input/output circuit 20 as a data mask signal DQM0-7.

The data input/output circuit 20 outputs read data sequentially transferred during read operation from a memory cell array ARY via a data bus DB to data terminals DQ0-63 in synchronization with rising or falling edges of the clock signal CLK. The data input/output circuit 20 receives write data sequentially supplied during write operation to the data terminals DQ0-63 in synchronization with rising or falling edges of the clock signal CLK and supplies the received write data to the memory cell array ARY via the data bus DB. That is, the memory MEM in the present embodiment is a DDR (Double Data Rate) type semiconductor memory. Incidentally, read data may be output in synchronization with a data strobe signal DQS generated by the memory MEM and write data may be received in synchronization with the data strobe signal DQS supplied to the memory MEM.

Further, the data input/output circuit 20 masks write data to memory cells MC and read data from the memory cells MC in accordance with logic of the data mask signal BDM0-7. Here, write data DQ0-63 and read data DQ0-63 are composed of eight data groups DQ0-7, DQ8-15, DQ16-23, DQ24-31, DQ32-39, DQ40-47, DQ48-55, and DQ56-63. Each data group is composed of one byte (eight bits). Each bit (mask bit) of the data mask signal BDM0-7 is used to mask/unmask data of the data groups DQ0-7, DQ8-15, DQ16-23, DQ24-31, DQ32-39, DQ40-47, DQ48-55, and DQ56-63 respectively.

The memory core 22 of respective banks BK0-1 includes a row address decoder RDEC, a column address decoder CDEC, a sense amplifier SA, a column switch CSW, a read amplifier RA, a write amplifier WA, the memory cell array ARY, and a precharge circuit (not shown). The memory cell array ARY has dynamic memory cells MC, and word lines WL and bit line pairs BL and /BL connected to the dynamic memory cells MC. The memory cell MC is formed at a crossing portion of the word line WL and the bit line BL or /BL.

The row address decoder RDEC decodes the row address signal RAD0-12 to select one of the word lines WL. The column address decoder CDEC decodes the column address signal CAD0-7 to select a pair of bit lines BL and /BL. The sense amplifier SA amplifies a difference of signal quantities of data read by the pair of bit lines BL and /BL during read operation or write operation.

The column switch CSW connects the bit lines BL and /BL corresponding to the column address signal CAD0-7 to the read amplifier RA and the write amplifier WA. The read amplifier RA amplifies during read operation a complementary read data signal output via the column switch CSW. The write amplifier WA amplifies during write operation a complementary write data signal supplied via the data bus DB and supplies the amplified data signal to the pair of bit lines BL and /BL.

The operation control circuit 24 of each bank BK0-1 outputs a control signal CNT for performing a read operation or a write operation of the memory core 22 in response to the read command RD or the write command WR. The control signal CNT includes a word line activation signal for determining an activation timing of the word lines WL, a sense amplifier activation signal for determining an activation timing of the sense amplifier SA, a column control signal for determining an ON timing of the column switch CSW, and a precharge control signal for determining a precharge timing of the bit lines BL and /BL.

Figure 2:
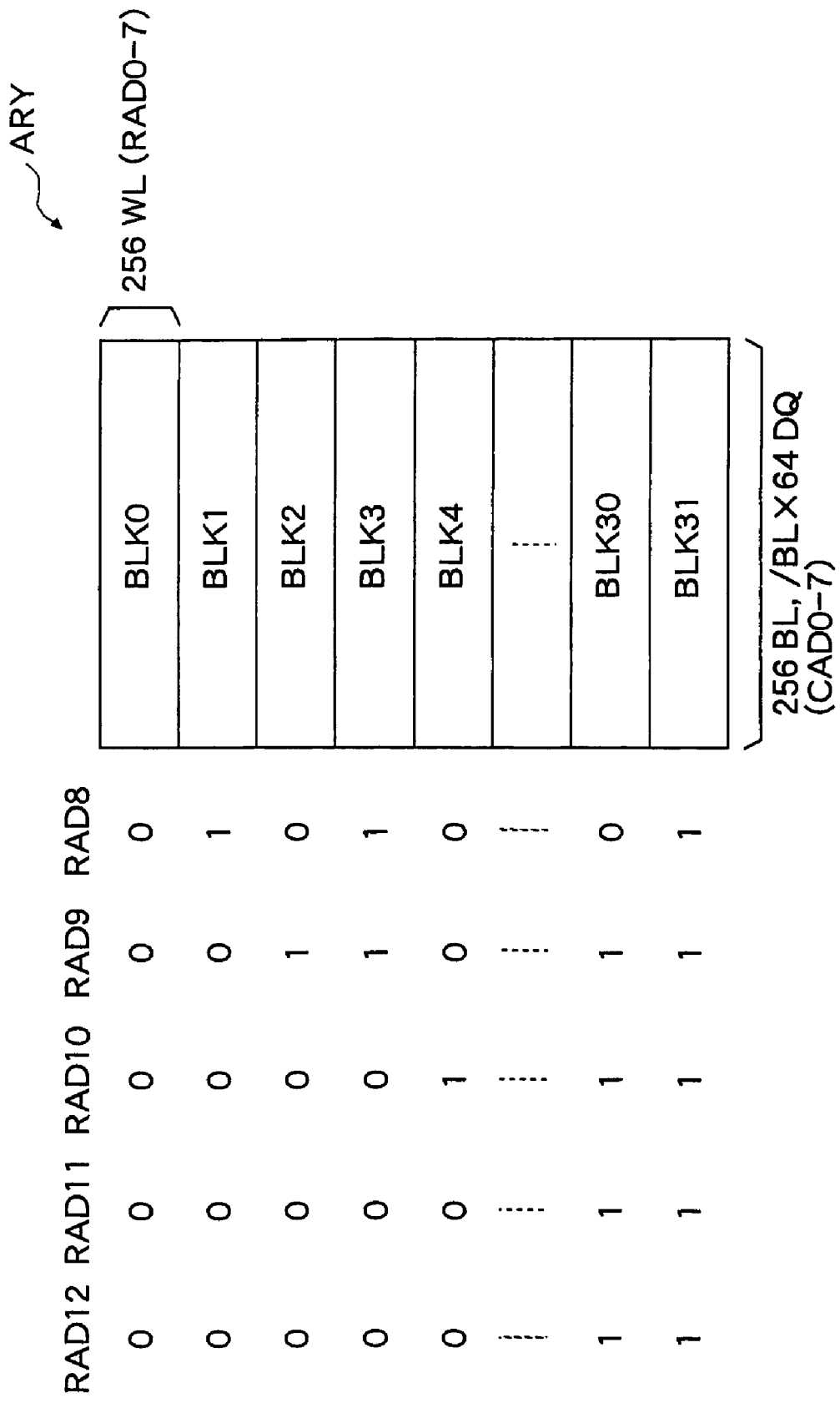
FIG. 2 is a block diagram showing details of a memory cell array shown in FIG. 1.

FIG. 2 shows details of the memory cell array ARY shown in FIG. 1. The memory cell array ARY are composed of, for example, 32 memory blocks BLK0-31. Each of memory blocks BLK0-31 has 256 word lines WL and each data terminals DQ0-63 has 256 pairs of bit lines BL and /BL. The row address signal RAD8-12 is used to select one of the memory blocks BLK0-31. The row address signal RAD0-7 is used to select one of the word lines WL in each memory blocks BLK0-31. The column address signal CAD0-7 is used to select the bit lines BL and /BL.

Figure 3:
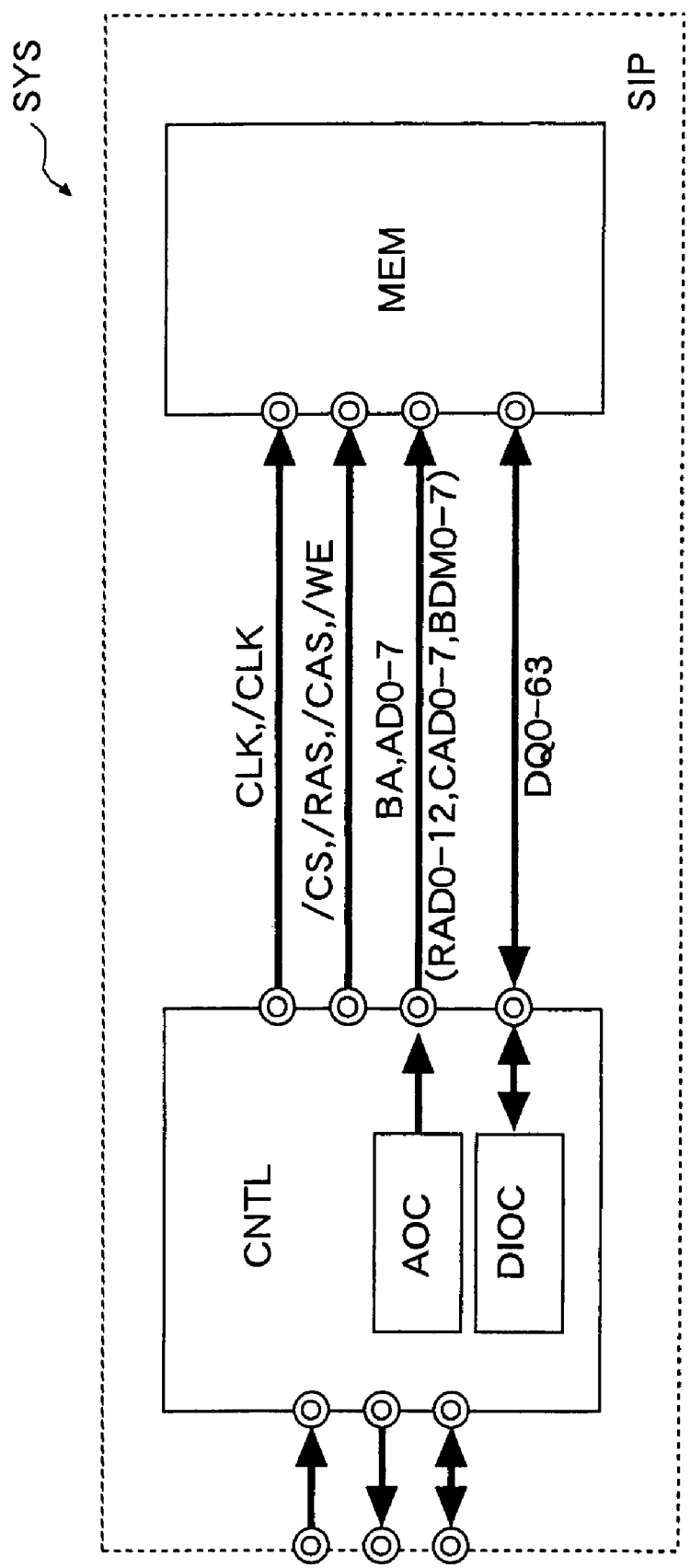
FIG. 3 is a block diagram showing an outline of a system to which the present invention is applied.

FIG. 3 shows an outline of a system to which the present invention is applied. A system SYS, for example, is formed as a system-in-package SIP by mounting a controller CNTL and the memory MEM on a package board. The controller CNTL is, for example, an ASIC chip having a CPU for accessing the memory MEM. An external source connected to the system SYS accesses the memory MEM via the controller CNTL. Thus, external terminals of the memory MEM are not connected to those of the SIP.

The controller CNTL has an address output circuit AOC and a data input/output circuit DIOC. The address output circuit AOC sequentially outputs a bank address signal BA, a row address signal RAD8-12 and RAD0-7, a column address signal CAD0-7, and a data mask signal BMD0-7 to the address terminals AD0-7 of the memory MEM in synchronization with transition edges of a clock signal CLK. The data input/output circuit DIOC outputs write data via the data terminals DQ0-63 of the memory MEM and inputs read data. Incidentally, the clock signals CLK and /CLK may be received from outside the system SYS, instead of generating them using the controller CNTL.

Figure 4:
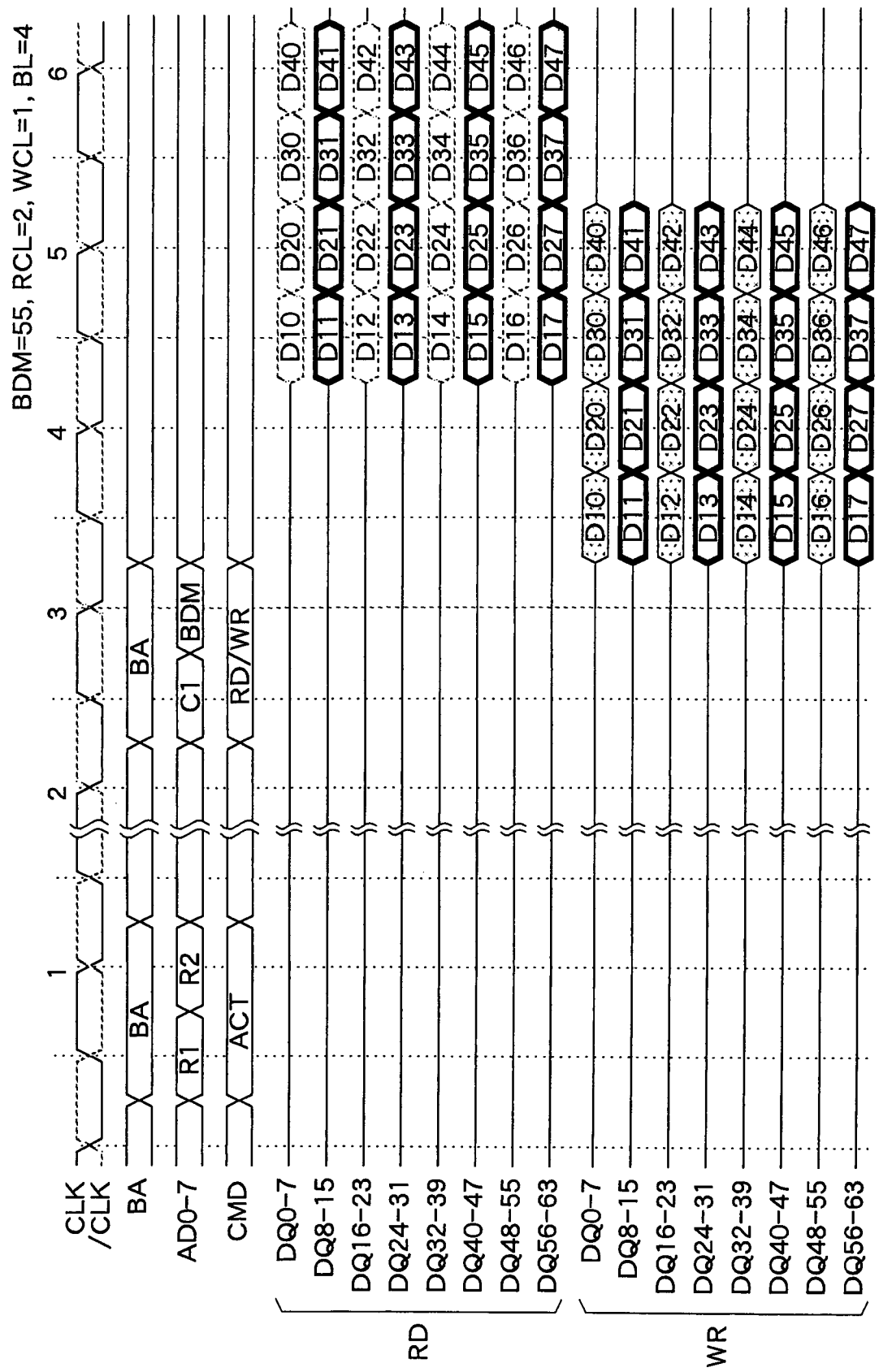
FIG. 4 is a timing chart showing operations of the first embodiment.

FIG. 4 shows operations of the first embodiment. In this example, a data mask signal BDM0-7 denoting "55" in hexadecimal is supplied. The read latency RCL is set to "2," the write latency WCL to "1," and the burst length BL to "4." Clock waveforms in solid lines denote a clock signal CLK and those in dotted lines denote a clock signal /CLK. The clock signals CLK and /CLK to which numerals 1 and 2 are attached in the diagram may not be continuous. The signal supplied to the memory MEM is output from the controller CNTL shown in FIG. 3 and read data D10-D47 output from the memory MEM is output to the controller CNTL.

Data of thick frames in read data of a read operation RD denotes data not to be masked and data of dotted lines denotes data to be masked. Read data to be masked is not output from the data input/output circuit 20 shown in FIG. 1. Thus, a data bus DQ0-63 of the SIP shown in FIG. 3 enters a high impedance state during a period of data of dotted lines.

Data of thick frames in write data of a write operation WR denotes data not to be masked and shaded data denotes data to be masked. Write data to be masked is supplied to the data input/output circuit 20, but is not written into the memory cells MC.

First, in synchronization with a first rising edge of the clock signal CLK, an active command ACT is supplied to a command terminal CMD, a bank address signal BA is supplied to a bank address terminal BA, and a first row address signal R1 (RAD8-12) is supplied to the address terminals AD0-7. The operation control circuit 24 of the bank BK corresponding to the bank address signal BA outputs the control signal CNT to activate the memory core 22 in response to the active command ACT. Then, for example, a boost voltage used for a high-level voltage of the word lines WL is supplied to a memory block BLK selected by the row address signal RAD8-12. That is, in response to the first row address signal RAD8-12 supplied, preparations for an access operation to the memory block BLK are made. By making preparations for an access operation by selecting a memory block BLK in advance using a portion of the row address signal RAD supplied first, an access time delay can also be prevented when the row address signal RAD0-12 is received at two or more different times.

Next, in synchronization with a falling edge of the first clock signal CLK, a second row address signal R2 (RAD0-7) is supplied. Then, one of the word lines WL of the memory block BLK selected by the row address signal RAD0-7 in advance is activated. That is, one of the banks BK0-1 is activated to make the bank accessible. Thereafter, the active command ACT may be supplied to activate the other bank BK not activated.

In synchronization with a rising edge of the third clock signal CLK, the read command RD or the write command WR is supplied to the command terminal CMD, the bank address signal BA indicating the bank that performs an access operation is supplied to the bank address terminal BA, and a column address signal C1 (CAD0-7) is supplied to the address terminals AD0-7. The operation control circuit 24 outputs the control signal CNT for performing a read operation or a write operation to the memory core 22 depending on the read command RD or the write command WR. At this point, no read data is output from the memory cell array ARY and no write data is supplied to the data terminals DQ0-63. Thus, the memory MEM need not receive the data mask signal BDM0-7 together with the column address signal CAD0-7.

The data mask signal BDM0-7 is supplied in synchronization with a falling edge of the third clock signal CLK. In the present invention, the data mask signal BDM0-7 can be supplied using the entire address terminals AD0-7. In other words, the address terminals AD0-7 function as dedicated terminals for receiving the data mask signal BDM0-7 at the falling edge of the third clock signal CLK. Thus, mask control of data DQ0-63 can be performed without increasing the number of external terminals even when the number of bits of the data terminals DQ0-63 is large and the number of bits of the data mask signal BDM0-7 is large.

The controller CNTL may supply the data mask signal BDM0-7 half a clock after supplying the column address signal CAD0-7. Thus, the controller CNTL can have sufficient lead time to perform data mask control. In other words, a timing margin of a control circuit performing mask control of data can be increased in the controller CNTL, making it easier to design the controller CNTL.

In this example, logic of the data mask signal BDM0-7 is "55" in hexadecimal. In the present embodiment, data of the data groups DQ0-7, DQ16-23, DQ32-39, and DQ48-55 corresponding to the bit BDM indicating logic 1 is masked. Data of the data groups DQ8-15, DQ24-31, DQ40-47, and DQ56-63 corresponding to the bit BDM indicating logic 0 is not masked. In the read operation RD, first read data D10-D17 is output in synchronization with a rising edge of the fifth clock signal CLK, which is two clocks after receiving the read command RD. Thereafter, read data D20-D27, D30-D37, and D40-D47 is sequentially output in synchronization with a falling edge, a rising edge, and a falling edge of the clock signal CLK respectively (however, data to be masked is not output).

In the write operation WR, first write data D10-D17 is supplied to the memory MEM in synchronization with a rising edge of the fourth clock signal CLK, which is one clock after receiving the write command WR. Thereafter, write data D20-D27, D30-D37, and D40-D47 is sequentially supplied to the memory MEM in synchronization with a falling edge, a rising edge, and a falling edge of the clock signal CLK respectively (however, data to be masked is not written into the memory cells MC).

In the first embodiment described above, the memory MEM receives the column address signal CAD0-7 and the data mask signal BDM0-7 in synchronization with rising edges and falling edges of the clock signal CLK respectively. That is, the data mask signal BDM0-7 is supplied to the address terminals AD0-7 in a timing different from a receiving timing of the column address signal CAD0-7. Therefore, mask control of the data DQ0-63 can be performed without increasing the number of external terminals even when the number of bits of the data terminals DQ0-63 is large and the number of bits of the data mask signal BDM0-7 is large. More specifically, terminals (five) for supplying the row address signal RAD8-12 and those (eight) for supplying the data mask signal BDM0-7 can be reduced in comparison with a conventional model. As a result, chip sizes of the memory MEM and controller CNTL can be reduced and system costs can be lowered.

The address input circuit 16 receives the row address signal RAD0-12 in synchronization with rising edges and falling edges of the clock signal CLK, and the column address signal CAD0-7 and data mask signal BDM0-7 in synchronization with other rising edges and falling edges of the clock signal CLK. Thus, the data mask signal BDM0-7 can further be received with the same supply frequency of the row address signal RAD0-12 and column address signal CAD0-7 as before.

Figure 5:
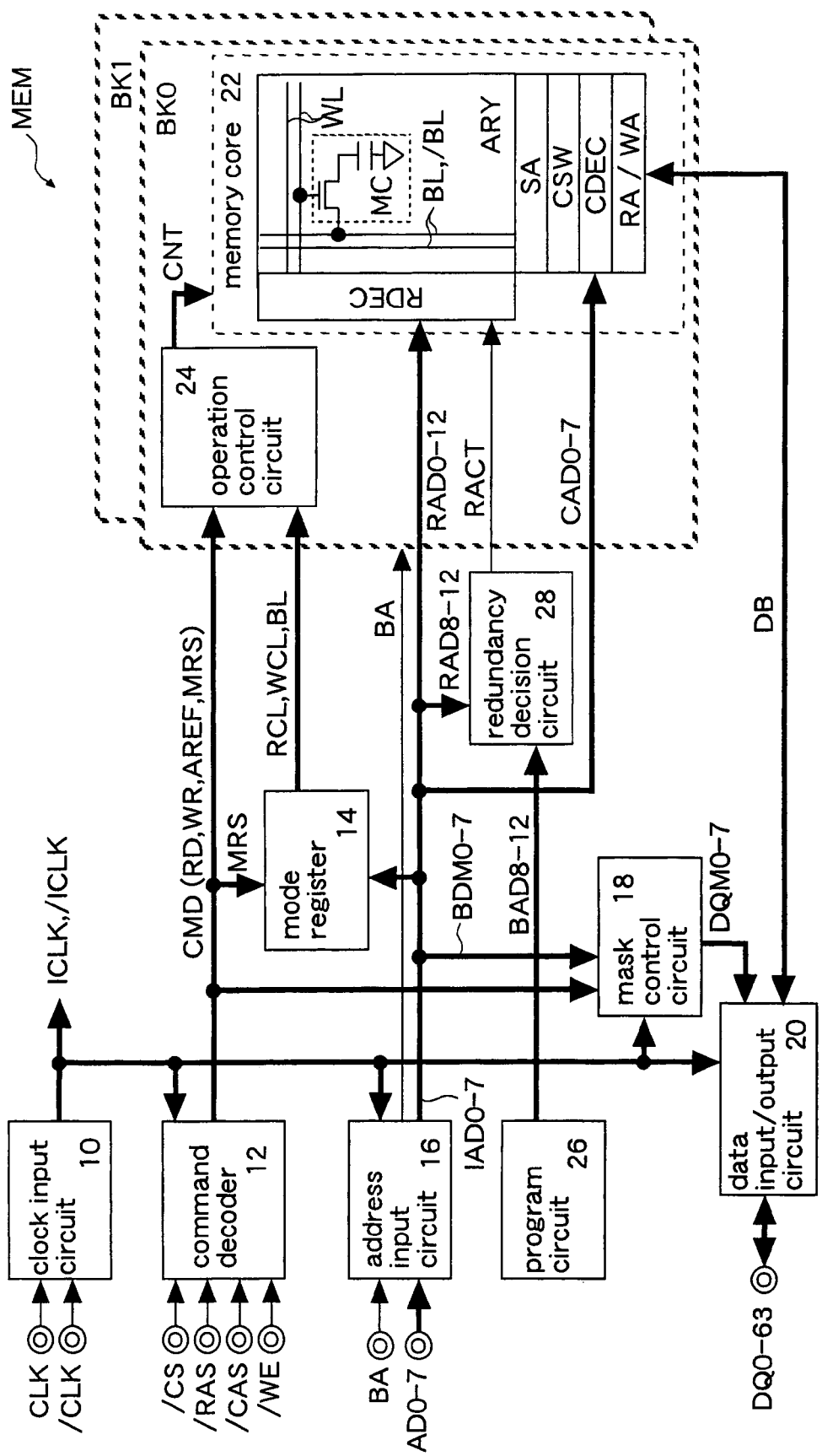
FIG. 5 is a block diagram showing a second embodiment of the present invention.

FIG. 5 shows the second embodiment of the present invention. The same symbols are attached to the same elements as those described in the first embodiment and a detailed description thereof is omitted. The memory MEM in this embodiment has a program circuit 26 and a redundancy determination circuit 28. Also, as shown in FIG. 6 described later, the memory cell array ARY is different from that in the first embodiment. Other elements are the same as those in the first embodiment. That is, the memory MEM is a clock synchronous type FCRAM. The memory MEM is accessed, as shown in FIG. 3, by the controller CNTL constituting the SIP.

The program circuit 26 has, for example, a fuse circuit in which a bad block address BAD indicating a bad memory block BLK is programmed and outputs a bad block address BAD8-12. The bad block address BAD8-12 corresponds to the row address signal RAD8-12. The program circuit 26 functions as a bad address memory circuit storing bad block addresses BAD.

The redundancy determination circuit 28 activates a redundancy activation signal RACT to a high logical level when a value of the row address signal RAD8-12 coincides with that of the bad block address BAD8-12. Whether a memory block is bad can be determined based on the first row address signal RAD8-12 supplied in synchronization with the rising edge of the first clock signal CLK shown in FIG. 4.

When an activated redundancy activation signal RACT is received, the row address decoder RDEC prohibits access to a memory block BLK selected by the row address signal RAD8-12 and allows access to the redundancy memory block RBLK (FIG. 6). That is, the bad normal memory block BLK is replaced by the redundancy memory block RBLK. Replacement control of memory blocks BLK can be performed in synchronization with the rising edge of the first clock signal CLK shown in FIG. 4. Thus, an access time of an access operation to the redundancy memory block RBLK will not be delayed.

If a determination time of the redundancy determination circuit 28 affects the access time, preparations for access operations to both the memory block BLK selected by the row address signal RAD8-12 and the redundancy memory block RBLK may be started in synchronization with the rising edge of the first clock signal CLK to cancel one of the access operations after a redundancy determination is made.

FIG. 6 shows details of the memory cell array ARY shown in FIG. 5. The memory cell array ARY is composed of 32 normal memory blocks BLK0-31 and one redundancy memory block RBLK. Each memory block BLK0-31 has the same configuration as that of the first embodiment. The redundancy memory block RBLK has the same configuration as that of each memory block BLK0-31.

Also in the second embodiment, the same effects as those of the first embodiment described above can be obtained. Further, in the present embodiment, a redundancy determination can be made using the first row address signal RAD8-12 of the row address signal RAD0-12 supplied at two different times by dividing the signal into two portions. Thus, when an access request to a bad memory block BLK occurs, an access operation to the redundancy memory block RBLK can be started earlier, preventing a longer access time.

Figure 7:
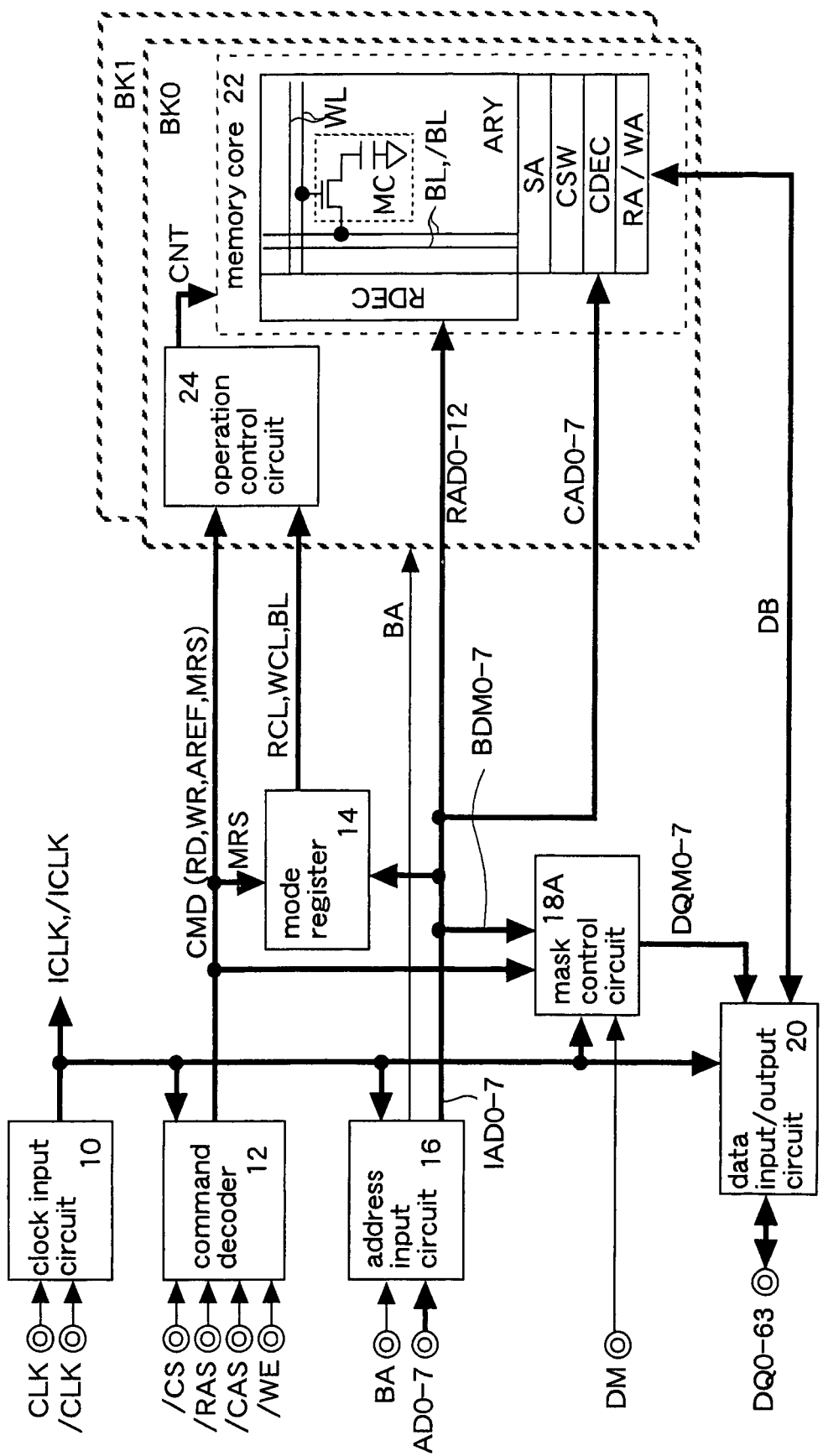
FIG. 7 is a block diagram showing a third embodiment of the present invention.

FIG. 7 shows the third embodiment of the present invention. The same symbols are attached to the same elements as those described in the first embodiment and a detailed description thereof is omitted. In the present embodiment, a mask control circuit 18A is formed instead of the mask control circuit 18 in the first embodiment. Also, a data mask terminal DM for receiving a 1-bit data mask signal DM (second data mask signal) is formed. Other elements are the same as those in the first embodiment. That is, the memory MEM is clock synchronous type FCRAM. The memory MEM is accessed, as shown in FIG. 3, by the controller CNTL constituting the SIP. The controller CNTL has a mask control circuit for generating a data mask signal DM and the data mask terminal for outputting the data mask signal DM.

The mask control circuit 18A performs a logical OR operation of a value of each of the data mask signal BDM0-7 and that of the data mask signal DM, and outputs an operation result as a data mask signal DQM0-7. The data input/output circuit 20 masks read data and write data for each data group in accordance with logic of each bit of the data mask signal DQM0-7.

Figure 8:
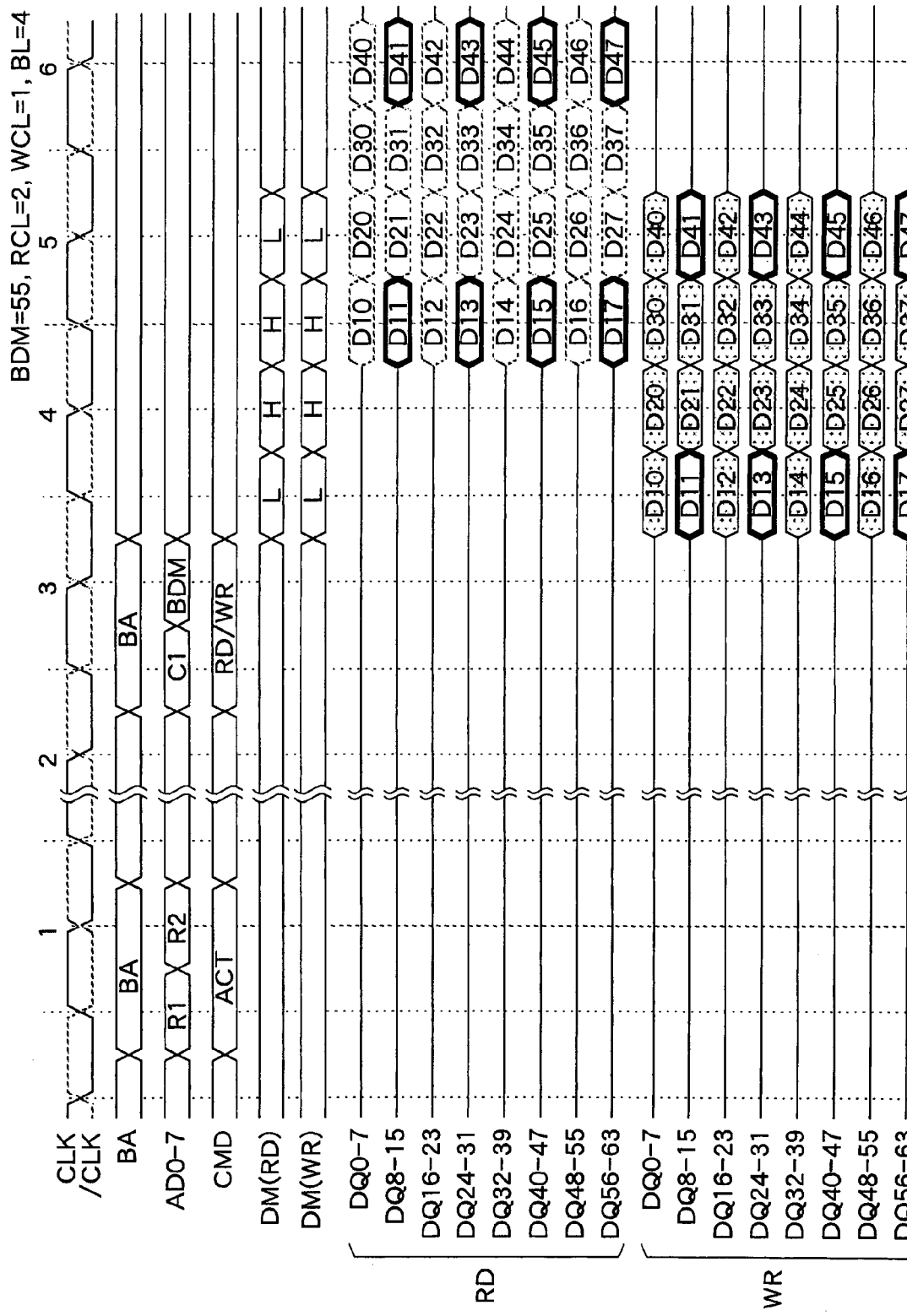
FIG. 8 is a timing chart showing operations of the third embodiment.

FIG. 8 shows operations of the third embodiment. A detailed description of the same operation as that described in FIG. 4 is omitted. In this embodiment, when performing a read operation, the data mask signal DM is supplied to the memory MEM each in synchronization with the falling edge and rising edge of the next clock signal CLK after receiving the read command RD. When performing a write operation, the data mask signal DM is supplied to the memory MEM each in synchronization with a supply timing of write data. In this example, as many data mask signals DM as ("4" in this example) corresponding to a burst length are supplied in response to one read command RD or one write command WR.

Operations up to the third clock cycle are the same as those in FIG. 4. In the read operation, the data mask signals DM of a low logical level L, high logical level H, high logical level H, and low logical level L are supplied one clock before outputting read data D10-17, D20-27, D30-37, and D40-47 respectively. In the write operation, the data mask signals DM of the low logical level L, high logical level H, high logical level H, and low logical level L are supplied concurrently with input of write data D10-17, D20-27, D30-37, and D40-47 respectively.

The mask control circuit 18A outputs a logical OR of the data mask signals BDM0-7 and DM as a data mask signal DQM0-7. Thus, data of the data groups DQ0-7, DQ16-23, DQ32-39, and DQ48-55 corresponding to high logical level bits of the data mask signal BDM0-7 is always masked. Data of the data groups DQ8-15, DQ24-31, DQ40-47, and DQ56-63 corresponding to low logical level bits of the data mask signal BDM0-7, on the other hand, is masked only when the data mask signal DM is at the high logical level H.

Also in the third embodiment, the same effects as those of the first embodiment described above can be obtained. Further, in the present embodiment, more complex mask control can be performed by forming the data mask terminal DM for receiving the data mask signal DM to minimize an increase in the number of external terminals.

Figure 9:
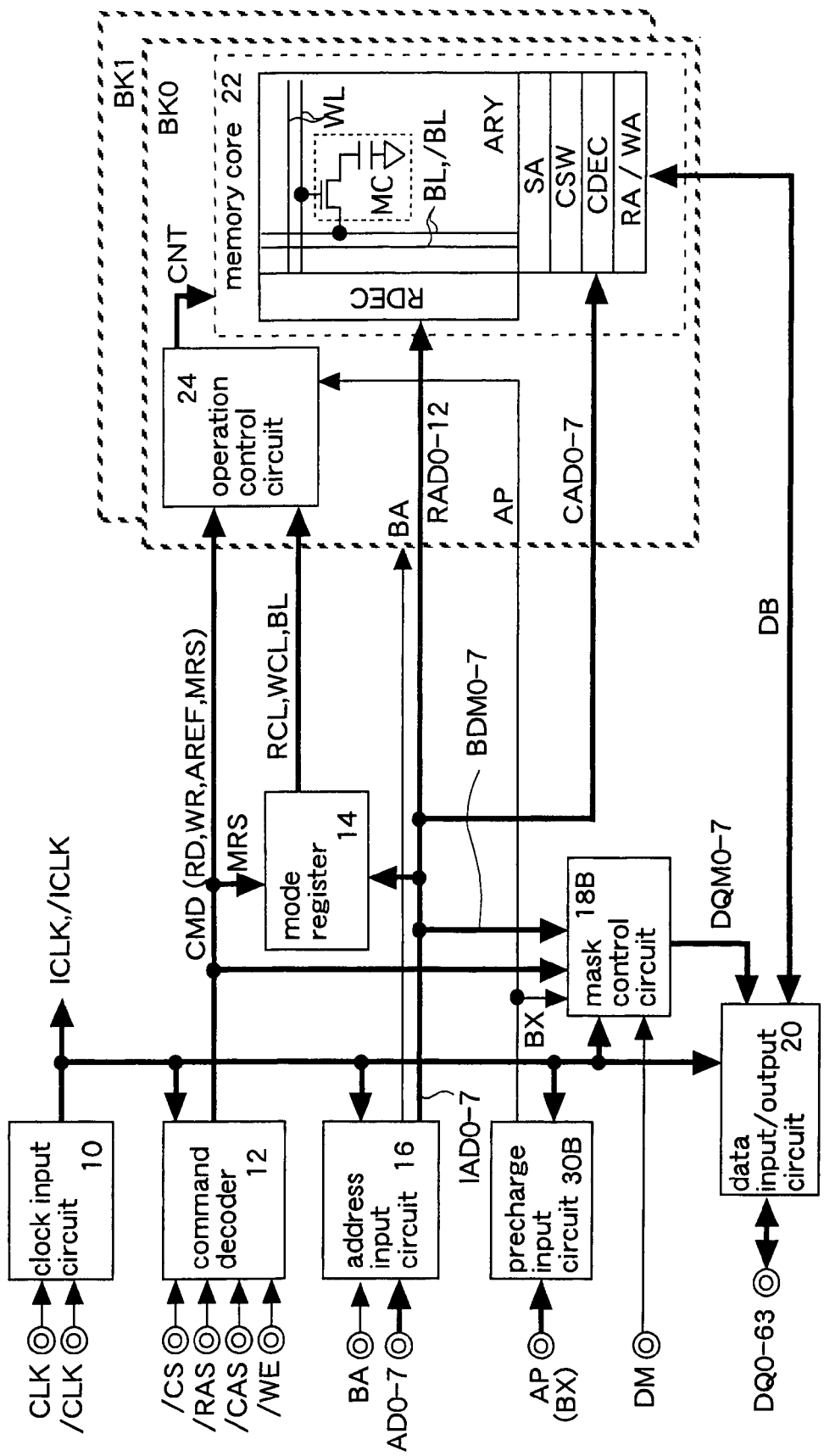
FIG. 9 is a block diagram showing a fourth embodiment of the present invention.

FIG. 9 shows the fourth embodiment of the present invention. The same symbols are attached to the same elements as those described in the first and third embodiments and a detailed description thereof is omitted. In the present embodiment, a mask control circuit 18B is formed instead of the mask control circuit 18 in the first embodiment. Also, a data mask terminal DM for receiving a 1-bit data mask signal DM (second data mask signal) is formed. Further, the memory MEM has an auto precharge terminal AP and a precharge input circuit 30B. Other elements are the same as those in the first embodiment. That is, the memory MEM is a clock synchronous type FCRAM. When a high logical level auto precharge signal AP is received together with the read command RD and write command WR, the memory MEM automatically performs a precharge operation after a read operation and write operation are completed.

The memory MEM is accessed, as shown in FIG. 3, by the controller CNTL constituting the SIP. The controller CNTL has a mask control circuit for generating a data mask signal DM, a data mask terminal for outputting the data mask signal DM, a precharge control circuit for generating an auto precharge signal AP, and an auto precharge terminal for outputting the auto precharge signal AP. The auto precharge terminal AP functions also as a data mask terminal for receiving a data mask signal BX.

The precharge input circuit 30B sequentially receives the 1-bit auto precharge signal AP and the 1-bit data mask signal BX (third data mask signal) supplied to the auto precharge terminal AP in synchronization with a rising edge and a falling edge of the clock signal CLK. The mask control circuit 18B performs a logical operation of a value of each bit of the data mask signal BDM0-7, that of the data mask signal DM, and that of the data mask signal BX, and outputs an operation result as a data mask signal DQM0-7. The data input/output circuit 20 masks read data and write data for each data group in accordance with logic of the data mask signal DQM.

Figure 10:
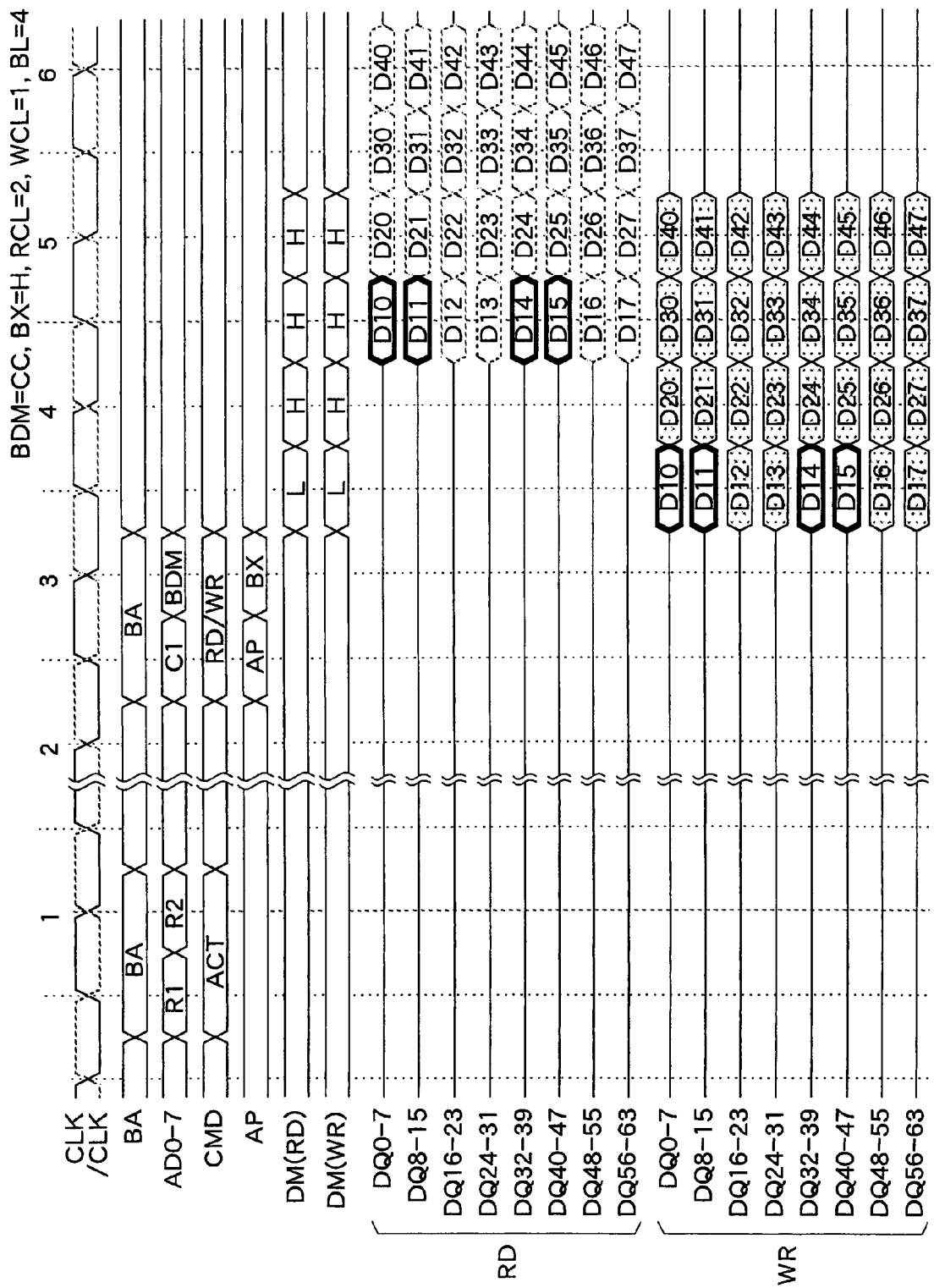
FIG. 10 is a timing chart showing an operation of the fourth embodiment.

FIG. 10 shows operations of the fourth embodiment. A detailed description of the same operation as that described in FIG. 4 or FIG. 8 is omitted. Excluding signals supplied to the auto precharge terminal AP, operations up to the third clock cycle are the same as those in FIG. 4. The precharge input circuit 30B receives the auto precharge signal AP in synchronization with a transition edge (rising edge) of the clock signal CLK receiving a column address signal C1 (CAD0-7) and the data mask signal BX in synchronization with a transition edge (falling edge) of the clock signal CLK receiving of the data mask signal BDM0-7. In this example, the data mask signal BX is at the high logical level H and the data mask signal BDM0-7 is "CC" in hexadecimal. Supply specifications of the data mask signal DM are the same as those in the third embodiment.

When the data mask signal BX is at the high logical level H, the mask control circuit 18B performs a logical OR operation of a value of each bit of the data mask signal BDM0-7 and that of the data mask signal DM, and outputs an operation result as a data mask signal DQM0-7. Thus, read data and write data corresponding to the data mask signal DM at the high logical level or the data mask signal BDM0-7 at the high logical level are masked.

Figure 11:
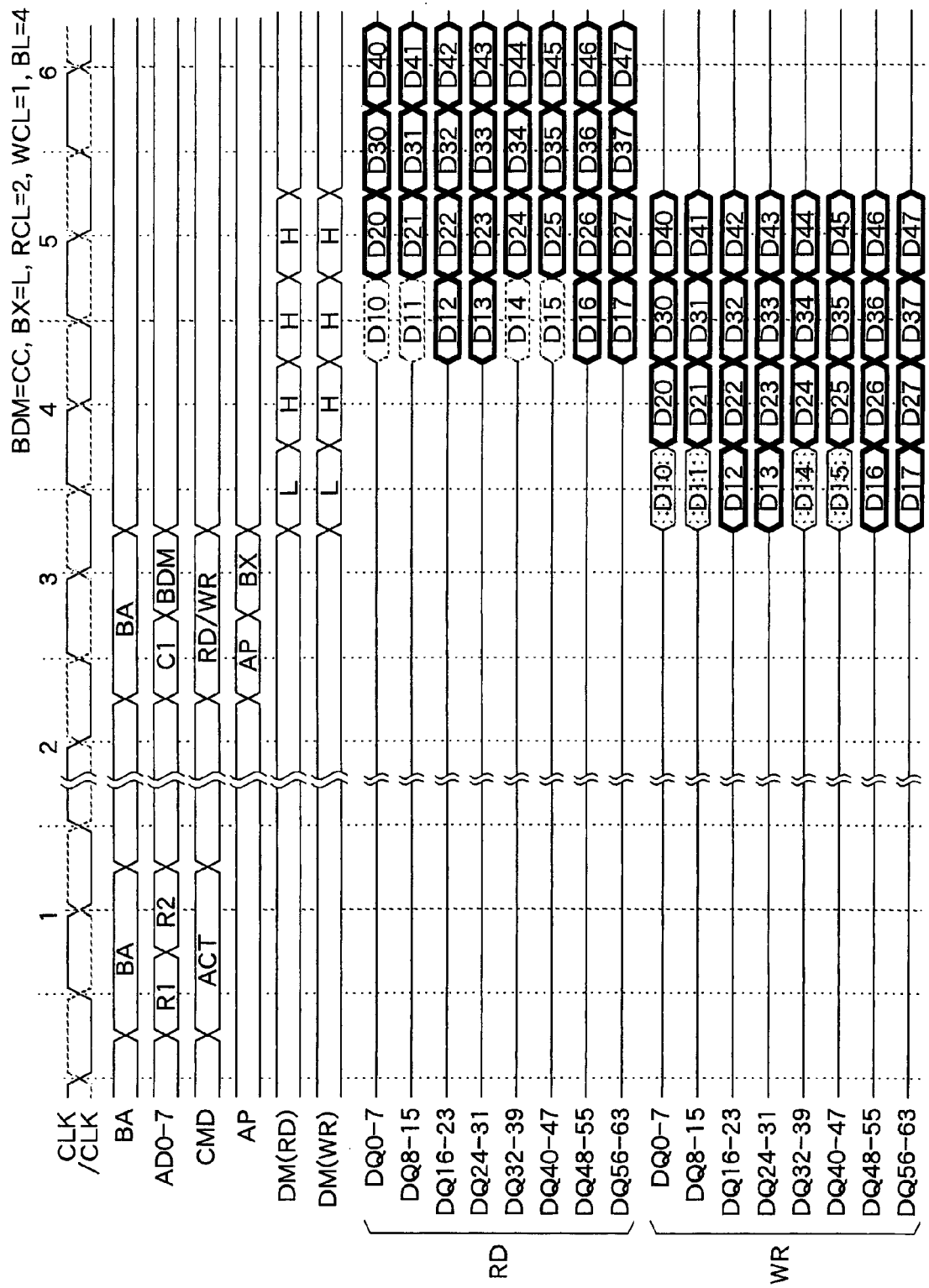
FIG. 11 is a timing chart showing other operations of the fourth embodiment.

FIG. 11 shows other operations of the fourth embodiment. A detailed description of the same operation as that described in FIG. 4, FIG. 8, or FIG. 10 is omitted. In this example, the data mask signal BX is at the low logical level L and the data mask signal BDM0-7 is "CC" in hexadecimal. Supply specifications of the data mask signal DM are the same as those in the third embodiment.

When the data mask signal BX is at the low logical level L, the mask control circuit 18B performs a logical OR operation of a value of each bit of the data mask signal BDM0-7 and that of the data mask signal DM, and outputs a reversal of an operation result as a data mask signal DQM0-7. Thus, read data and write data corresponding to the data mask signal DM at the high logical level or the data mask signal BDM0-7 at the high logical level are not masked. In other words, only read data and write data corresponding to the data mask signal DM at the low logical level or the data mask signal BDM0-7 at the low logical level are masked.

Also in the fourth embodiment, the same effects as those of the first and third embodiments described above can be obtained. Further, in the present embodiment, more complex mask control can be performed using the data mask signal BX. More specifically, only one byte of burst read data or burst write data can be masked, or burst read data or burst write data excluding one byte can be masked. This facilitates mask control of image processing data and the like in which mask/unmask is frequently set in byte units. Also, by receiving the data mask signal BX using the auto precharge terminal AP, complex mask control can be performed by minimizing an increase in the number of external terminals.

Figure 12:
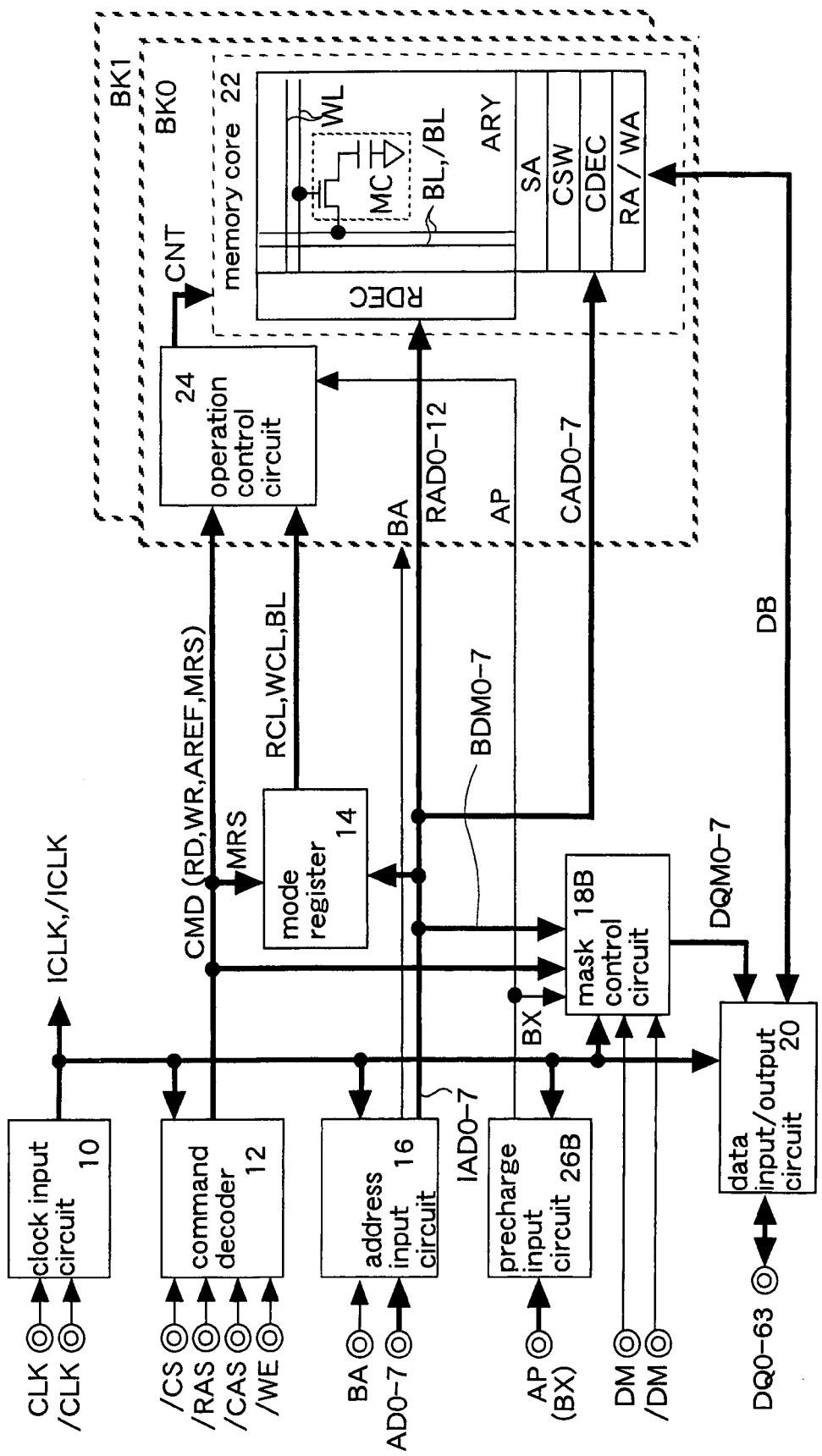
FIG. 12 is a block diagram showing a fifth embodiment of the present invention.

FIG. 12 shows the fifth embodiment of the present invention. The same symbols are attached to the same elements as those described in the first, third, and fourth embodiments and a detailed description thereof is omitted. In the present embodiment, a mask control circuit 18C is formed instead of the mask control circuit 18B in the fourth embodiment. Also, a data mask terminal /DM for receiving a 1-bit data mask signal /DM (second data mask signal) is newly formed. Other elements are the same as those in the fourth embodiment. That is, the memory MEM is a clock synchronous type FCRAM The mask control circuit 18C performs a logical operation of a value of each bit of the data mask signal BDM0-7, that of the data mask signal DM and /DM, and that of the data mask signal BX, and outputs an operation result as a data mask signal DQM0-7. The data input/output circuit 20 masks read data and write data for each data group in accordance with logic of the data mask signal DQM.

Figure 13:
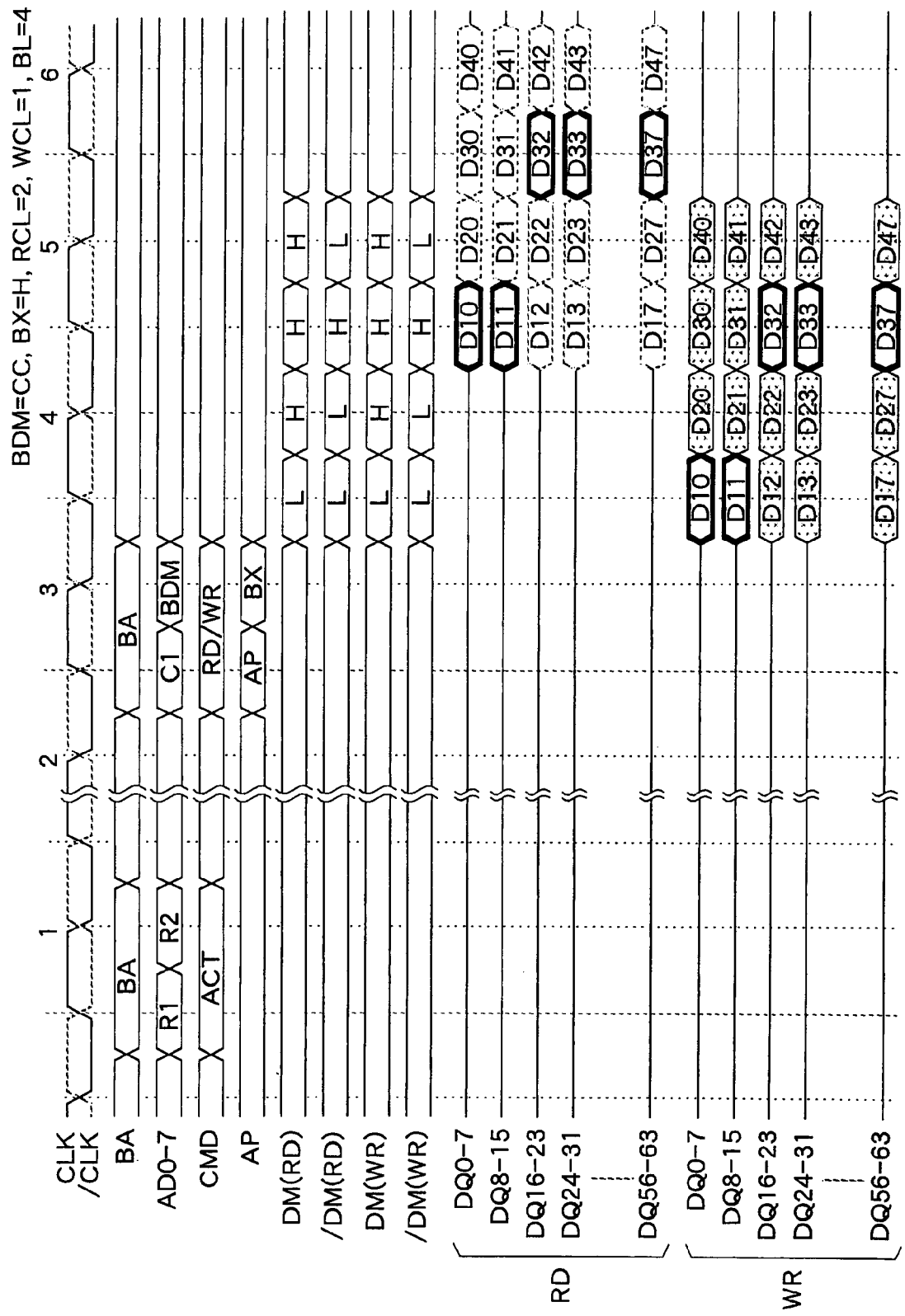
FIG. 13 is a timing chart showing an operation of the fifth embodiment.

FIG. 13 shows operations of the fifth embodiment. A detailed description of the same operation as that described in FIG. 4, FIG. 8, or FIG. 10 is omitted. Operations up to the third clock cycle are the same as those in FIG. 10. In this example, the data mask signal BX is at the high logical level H and the data mask signal BDM0-7 is "CC" in hexadecimal. Supply specifications of the data mask signal DM are the same as those in the third embodiment. The data mask signal /DM is supplied in synchronization with the data mask signal DM.

When the value of each bit of the data mask signal BDM0-7 is at the low logical level, the mask control circuit 18C sets each bit of the data mask signal DQM0-7 to the same logic as that of the data mask signal DM. That is, when the value of each bit of the data mask signal BDM0-7 is at the low logical level, the mask control circuit 18C selects the data mask signal DM and performs a logical OR operation of each bit of the data mask signal DQM0-7 and the data mask signal DM to output an operation result as a data mask signal DQM0-7.

Also, when the value of each bit of the data mask signal BDM0-7 is at the high logical level, the mask control circuit 18C sets each bit of the data mask signal DQM0-7 to logic opposite to that of the data mask signal /DM. That is, when the value of each bit of the data mask signal BDM0-7 is at the high logical level, the mask control circuit 18C selects the data mask signal /DM and performs a logical NAND operation (logical OR in negative logic) of each bit of the data mask signal DQM0-7 and the data mask signal /DM to output an operation result as a data mask signal DQM0-7.

Figure 14:
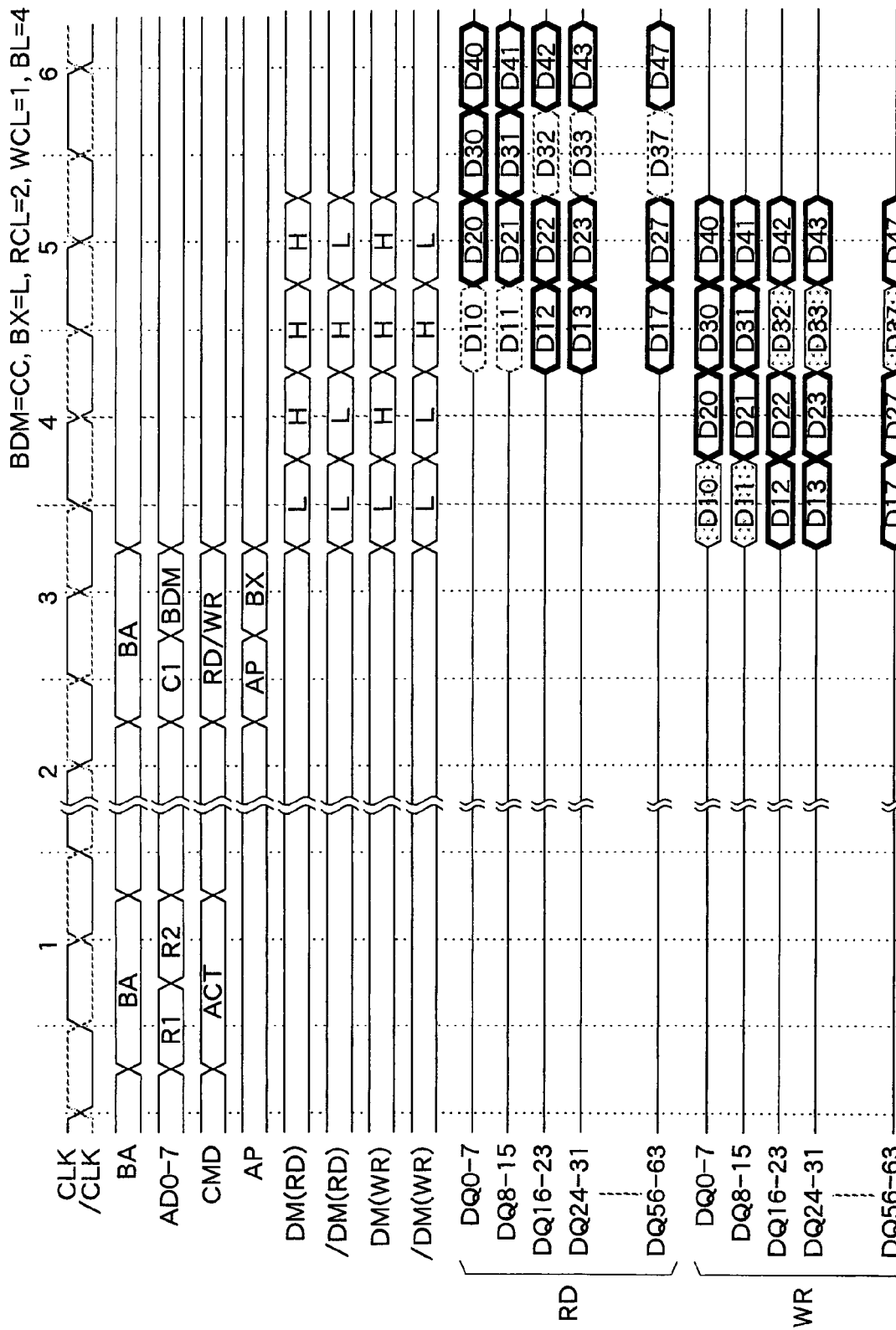
FIG. 14 is a timing chart showing other operations of the fifth embodiment.

FIG. 14 shows other operations of the fifth embodiment. A detailed description of the same operation as that described in FIG. 4, FIG. 8, or FIG. 11 is omitted. Operations up to the third clock cycle are the same as those in FIG. 11. In this example, the data mask signal BX is at the low logical level L and the data mask signal BDM0-7 is "CC" in hexadecimal. Supply specifications of the data mask signals DM and /DM are the same as those in the fifth embodiment.

When the value of each bit of the data mask signal BDM0-7 is at the low logical level, the mask control circuit 18C sets each bit of the data mask signal DQM0-7 to logic opposite to that of the data mask signal DM. That is, when the value of each bit of the data mask signal BDM0-7 is at the low logical level, the mask control circuit 18C selects the data mask signal DM and performs a logical NOR operation (logical AND in negative logic) of each bit of the data mask signal DQM0-7 and the data mask signal DM to output an operation result as a data mask signal DQM0-7.

Also, when the value of each bit of the data mask signal BDM0-7 is at the high logical level, the mask control circuit 18C sets each bit of the data mask signal DQM0-7 to the same logic as that of the data mask signal /DM. That is, when the value of each bit of the data mask signal BDM0-7 is at the high logical level, the mask control circuit 18C selects the data mask signal /DM and performs a logical AND operation of each bit of the data mask signal DQM0-7 and the data mask signal /DM to output an operation result as a data mask signal DQM0-7.

Also in the fifth embodiment, the same effects as those of the first, third, and fourth embodiments described above can be obtained.

The embodiments above have described examples in which the present invention is applied to a DDR type FCRAM (pseudo SRAM). However, the present invention is not limited to the above embodiments. For example, the present invention may be applied to a DDR type SDRAM, a SDR (Single Data Rate) type FCRAM, or a SDRAM.

The embodiments above have described examples in which the present invention is applied to a semiconductor memory with a DRAM interface (address multiplex mode by /RAS and /CAS) have been described. However, the present invention is not limited to the above embodiments. For example, if the present invention is applied to a semiconductor memory with an SRAM interface (address non-multiplex mode by a chip enable signal, /CE and the like), the same effects as described above can be obtained. In this case, the row address signal RAD0-12, for example, is supplied at two different times by dividing the signal into two portions via an 8-bit row address terminal. The column address signal CAD0-7 is supplied at once via an 8-bit column address terminal. The data mask signal BDM0-7 is supplied to the column address terminal.

The embodiments above have described examples in which the memory MEM receives the row address signal RAD0-12 by dividing the signal into high-order five bits (RAD8-12) and low-order eight bits (RAD0-7). However, the present invention is not limited to the above embodiments. For example, the memory MEM may receive the row address signal RAD0-12 by dividing the signal into high-order eight bits (RAD5-12) and low-order five bits (RAD0-4). In this case, more row address bits can be received in synchronization with the rising edge of the first clock signal CLK. Thus, operations of circuits related to the row address signal RAD can be started earlier.

The embodiments above have described examples in which the memory MEM receives the row address signal RAD0-12 at two different times and the column address signal CAD0-7 and data mask signal BDM0-7 at once. However, the present invention is not limited to the above embodiments. For example, the memory MEM may receive the row address signal RAD at three or more different times by dividing the signal into three or more portions, and the column address signal at two or more different times by dividing the signal into two or more portions. Further, the data mask signal BDM may be received at two or more different times by dividing the signal into two or more portions.

The embodiments above have described examples in which the data mask signal BDM0-7 is used to mask both write data and read data. However, the present invention is not limited to the above embodiments. For example, the data mask signal BDM0-7 may be used to mask write data only or read data only.

Further, the program circuit 26, redundancy determination circuit 28, and redundancy memory block RBLK for rescuing a bad memory block in the second embodiment may be formed in the memory MEM of the third to fifth embodiments.

The invention is not limited to the above embodiments and various modifications may be made without departing from the spirit and scope of the invention. Any improvement may be made in part or all of the components.

What is claimed is:
1. A semiconductor memory, comprising:
 a memory cell array having memory cells, and a word line and a bit line connected to the memory cells;

an address input circuit that sequentially receives a first address signal, a second address signal, and a first data mask signal supplied to an address terminal in synchronization with transition edges of a clock signal; and a data input/output circuit that inputs/outputs data via a data terminal and masks at least either of write data to said memory cells and read data from said memory cells in accordance with logic of said first data mask signal, wherein said address input circuit receives a portion of bits of said first address signal and remaining bits of said first address signal in synchronization with adjacent transition edges of said clock signal, and receives said second address signal and said first data mask signal in synchronization with adjacent transition edges of said clock signal.

2. The semiconductor memory according to claim 1, further comprising:

a plurality of memory blocks constituting said memory cell array, wherein said address input circuit receives said first address signal at two or more times in synchronization with transition edges of said clock signal; and a portion of said first address signal supplied first to said address terminal is used to select one of said memory blocks.

3. The semiconductor memory according to claim 1, further comprising:

a plurality of normal memory blocks and a redundancy memory block constituting said memory cell array;

a bad address memory circuit storing therein a bad block address indicating a bad normal memory block; and a redundancy determination circuit that outputs a redundancy activation signal to substitute the redundancy memory block for the bad normal memory block when a block selection address of said first address signal coincides with said bad block address, the block selection address being for selecting said normal memory block, wherein:

said address input circuit receives said first address signal at two or more times in synchronization with the transition edges of said clock signal; and a portion of said first address signal supplied first to said address terminal includes said block selection address.

4. The semiconductor memory according to claim 1, wherein a number of bits of said first address signal is larger than that of said second address signal.

5. The semiconductor memory according to claim 1, wherein:

said write data and said read data are each composed of a plurality of data groups; and said first data mask signal is composed of a plurality of mask bits for setting mask/unmask to said data groups.

6. The semiconductor memory according to claim 1, further comprising:

a mask control circuit that performs logical operations of bit values of said first data mask signal and of a second data mask signal received via a data mask terminal, wherein said data input/output circuit masks at least either of said write data and said read data in accordance with logic obtained from an operation of said mask control circuit.

7. The semiconductor memory according to claim 6, wherein:

said data input/output circuit separately receives two or more portions of said write data in accordance with said second address signal; and said mask control circuit receives said second data mask signal corresponding to the two or more portions of said write data and performs the logical operation of each of the two or more portions thereof.

8. The semiconductor memory according to claim 6, wherein:

said data input/output circuit separately outputs two or more portions of said read data in accordance with said second address signal; and said mask control circuit receives said second data mask signal in accordance with the two or more portions of said read data and performs the logical operation of each of the two or more portions thereof.

9. The semiconductor memory according to claim 6, further comprising:

a precharge input circuit that sequentially receives an auto precharge signal and a third data mask signal in synchronization with the transition edges of said clock signal; wherein, said mask control circuit performs the logical operations of the bit values of said first, second, and third data mask signals; and said data input/output circuit masks at least either of said write data and said read data in accordance with the logic obtained from the operation of said mask control circuit.

10. The semiconductor memory according to claim 1, wherein said first address signal is a row address signal for selecting said word line and said second address signal is a column address signal for selecting said bit line.

11. A controller controlling access to a semiconductor memory having a memory cell array composed of memory cells, comprising:

an address output circuit that sequentially outputs a first address signal, a second address signal, and a first data mask signal to an address terminal of said semiconductor memory in synchronization with transition edges of a clock signal, the first data mask signal being for masking at least either of write data into said memory cells and read data from said memory cells in said semiconductor memory; and a data input/output circuit that outputs said write data and inputs said read data via a data terminal of said semiconductor memory, wherein said address output circuit outputs a portion of bits of said first address signal and remaining bits in synchronization with adjacent transition edges of said clock signal, and outputs said second address signal and said first data mask signal in synchronization with adjacent transition edges of said clock signal.

12. The controller according to claim 11, wherein:

said address output circuit outputs said first address signal at two or more times in synchronization with the transition edges of said clock signal; and a portion of said first address signal supplied first to said address terminal is used to select one of said memory blocks constituting said memory cell array.

13. The controller according to claim 11, wherein:

a number of bits of said first address signal is larger than that of said second address signal.

14. An operation method of a semiconductor memory comprising:

receiving, by an address terminal, a portion of bits of a first address signal for selecting memory cells and remaining bits of said first address signal in synchronization with adjacent transition edges of a clock signal;

receiving, by the address terminal, a second address signal for selecting memory cells and a first data mask signal for masking data input/output into/from said memory cells in synchronization with adjacent transition edges of said clock signal; and inputting/outputting data via a data terminal and masking at least either of write data into said memory cells and read data from said memory cells in accordance with logic of said first data mask signal.

15. The operation method of a semiconductor memory according to claim 14, in which the semiconductor memory comprises a plurality of memory blocks constituting said memory cell array, the method further comprising:

receiving said first address signal at two or more times in synchronization with the transition edges of said clock; and selecting one of said memory blocks by using a portion of said first address signal supplied first to said address terminal.

16. The operation method of a semiconductor memory according to claim 14, wherein
a number of bits of said first address signal is larger than that of said second address signal.

17. The operation method of a semiconductor memory according to claim 14, comprising:

performing a logical operation of bit values of said first data mask signal and of a second data mask signal received via a data mask terminal, and masking at east either of said write data and said read data in accordance with the logic obtained from said logical operation.

* * * * *

UNITED STATES PATENT AND TRADEMARK OFFICE
CERTIFICATE OF CORRECTION

PATENT NO. : 7,684,258 B2
APPLICATION NO. : 11/705405
DATED : March 23, 2010
INVENTOR(S) : Tatsuya Kanda It is certified that error appears in the above-identified patent and that said Letters Patent is hereby corrected as shown below:

Title Page

Item (73) Assignee, Please correct the city as follows:

--(73) Assignee from --Tokyo (JP)-- to read --Yokohama (JP)--

Signed and Sealed this

Thirteenth Day of July, 2010

David J. Kappos
*Director of the United States Patent and Trademark Office*